(12) United States Patent
Jeon et al.

(10) Patent No.: US 11,380,404 B2
(45) Date of Patent: Jul. 5, 2022

(54) MEMORY DEVICE AND METHOD OF READING DATA

(71) Applicant: SAMSUNG ELECTRONICS CO., LTD., Suwon-si (KR)

(72) Inventors: Su Chang Jeon, Seoul (KR); Seung Bum Kim, Hwaseong-si (KR); Ji Young Lee, Yeongtong-gu (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 17/099,678

(22) Filed: Nov. 16, 2020

(65) Prior Publication Data

US 2021/0074364 A1    Mar. 11, 2021

Related U.S. Application Data

(63) Continuation of application No. 16/434,968, filed on Jun. 7, 2019, now Pat. No. 10,867,682.

(30) Foreign Application Priority Data

Sep. 20, 2018   (KR) .................. 10-2018-0113034

(51) Int. Cl.
  *G11C 16/24*   (2006.01)
  *G11C 16/12*   (2006.01)
  *G11C 16/26*   (2006.01)

(52) U.S. Cl.
  CPC ............. *G11C 16/24* (2013.01); *G11C 16/12* (2013.01); *G11C 16/26* (2013.01)

(58) Field of Classification Search
  None
  See application file for complete search history.

(56) References Cited

U.S. PATENT DOCUMENTS

| 8,185,802 B2 | 5/2012 | Noguchi |
| 9,972,391 B2 | 5/2018 | Sakui et al. |
| 2010/0128532 A1* | 5/2010 | Hwang ................ G11C 16/344 365/185.11 |

(Continued)

FOREIGN PATENT DOCUMENTS

KR   20170086173 A   7/2017

*Primary Examiner* — James G Norman
(74) *Attorney, Agent, or Firm* — Volentine, Whitt & Francos, PLLC

(57) ABSTRACT

A non-volatile memory includes a memory cell region including an outer region proximate a first end of the memory cell region and an inner region separated from the first end by the outer region, first and second bit lines, an outer memory cell string including memory cells connected to an outer pillar extending vertically upward through the outer region, and an inner memory cell string including memory cells connected to an inner pillar extending vertically upward through the inner region, and a data input/output (I/O). The data I/O circuit includes a page buffer circuit that connects the first bit line during a first read operation directed to memory cells of the outer memory cell string, and connects the second bit line during a second read operation directed to memory cells of the inner memory cell string, and a read voltage determination unit that selects a first optimal read voltage used during the first read operation, and a second optimal read voltage used during the second read operation.

20 Claims, 13 Drawing Sheets

(56) References Cited

U.S. PATENT DOCUMENTS

| | | |
|---|---|---|
| 2016/0267991 A1* | 9/2016 | Hashimoto ............ G11C 16/10 |
| 2016/0329344 A1 | 11/2016 | Yeh et al. |
| 2017/0075757 A1 | 3/2017 | Im et al. |
| 2017/0123724 A1 | 5/2017 | Park et al. |
| 2018/0061464 A1 | 3/2018 | Yamauchi |
| 2018/0136860 A1 | 5/2018 | Lim |

* cited by examiner

MEMORY DEVICE AND METHOD OF READING DATA

This is a Continuation of U.S. application Ser. No. 16/434,968, filed Jul. 7, 2019, now U.S. Pat. No. 10,867,682 issued on Dec. 15, 2020, which claims priority from Korean Patent Application No. 10-2018-0113034 filed on Sep. 20, 2018 in the Korean Intellectual Property Office, the subject matter of which is hereby incorporated by reference.

BACKGROUND

The inventive concept relates generally to memory devices. More particularly, certain embodiments of the inventive concept relate to nonvolatile memory devices that perform read operations using one of multiple candidate read voltages.

Semiconductor memory devices can be roughly divided into two categories according to whether they retain stored data when disconnected from power. These categories include volatile memory devices, which lose stored data when disconnected from power, and non-volatile memory devices, which retain stored data when disconnected from power. Examples of volatile memory devices include static random access memory (SRAM) and dynamic random access memory (DRAM), and examples of nonvolatile memory devices include flash memory devices and read only memory (ROM).

Among nonvolatile memories, flash memory devices have gained increasing popularity in recent years due to attractive features such as relatively low cost, high storage capacity, low power consumption, fast access speed, and an ability to withstand physical shock.

Memory cells of a flash memory may store single-bit data or multi-bit data, depending on the memory's design. Where a memory cell stores single-bit data, it may have a threshold voltage corresponding to one of two threshold voltage states representing data "1" and data "0". Where a memory cell stores two-bit data, it may have a threshold voltage corresponding to one of four threshold voltage states representing data "11", "10", etc. Where a memory cell stores three-bit data, it may have a threshold voltage corresponding to one of eighth threshold voltage states representing data "111", "110", etc.

Memory cell(s) storing a particular data value may be interrogated or "read" during a read operation. Read operations may be variously defined depending on the performance characteristics of the constituent memory device. However, read operations are usually performed by selectively applying one or more control voltage(s) to various component(s) of a memory cell array including the memory cells to-be-read. Accurately defining and applying an appropriate read voltage is a material consideration in the definition of read operations.

SUMMARY

Embodiments of the inventive concept provide memory devices providing improved performance during read operations.

In one embodiment, the inventive concept provides a non-volatile memory including a memory cell region including an outer region proximate a first end of the memory cell region and an inner region separated from the first end by the outer region, first and second bit lines, an outer memory cell string including memory cells connected to an outer pillar extending vertically upward through the outer region, and an inner memory cell string including memory cells connected to an inner pillar extending vertically upward through the inner region, and a data input/output (I/O) circuit. The data I/O circuit includes a page buffer circuit that connects the first bit line during a first read operation directed to memory cells of the outer memory cell string, and connects the second bit line during a second read operation directed to memory cells of the inner memory cell string, and a read voltage determination unit that selects a first optimal read voltage used during the first read operation, and a second optimal read voltage used during the second read operation.

In another embodiment, the inventive concept provides a non-volatile memory including a memory cell region including a first end, an outer region proximate the first end and an inner region separated from the first end by the outer region, first and second bit lines, an outer memory cell string including memory cells connected to an outer pillar extending vertically upward through the outer region, and an inner memory cell string including memory cells connected to an inner pillar extending vertically upward through the inner region, and a data input/output (I/O) circuit. The data I/O circuit includes a page buffer circuit including a first page buffer that connects the first bit line during a first read operation directed to memory cells of the outer memory cell string, and a second page buffer that connects the second bit line during a second read operation directed to memory cells of the inner memory cell string, and a read voltage determination unit that selects a first optimal read voltage used during the first read operation, and a second optimal read voltage, different from the first optimal read voltage, used during the second read operation, wherein the first page buffer includes a first storing register that stores a first candidate read voltage and a second storing register that store a second candidate read voltage, and the read voltage determination unit selects one of the first candidate read voltage and the second candidate read voltage as the first optimal read voltage.

In another embodiment, the inventive concept provides a vertical NAND flash memory including a NAND memory cell region bounded on a first end by a first word line cut and bounded on a second end opposite the first end by a second word line cut, wherein the NAND memory cell region includes a first outer region proximate the first end, a second outer region proximate the second end, and an inner region between the first outer region and the second outer region, bit lines that extend over the memory cell region and include a first bit line and a second bit line, a first outer NAND string including NAND cells connected to an outer pillar extending vertically upward through the first outer region, and a second outer NAND string including NAND cells connected to an outer pillar extending vertically upward through the second outer region, a first inner NAND string including NAND cells connected to a first inner pillar extending vertically upward through the inner region, and a second inner NAND string including NAND cells connected to a second inner pillar extending vertically upward through the inner region, and a data input/output (I/O) circuit. The data I/O circuit includes a page buffer circuit including a first page buffer that connects the first bit line during a first read operation directed to memory cells of at least one of the first outer NAND string and the second outer NAND string, and a second page buffer that connects the second bit line during a second read operation directed to memory cells of at least one of the first inner NAND string and the second inner NAND string, and a read voltage determination unit that selects a first optimal read voltage used during the first read operation, and a second optimal read voltage used during the second read operation.

In another embodiment, the inventive concept provides a method of reading data in a non-volatile memory including a memory cell region having a first end, an outer region proximate the first end and an inner region separated from the first end by the outer region, first and second bit lines, an outer memory cell string including first memory cells connected to an outer pillar extending vertically upward through the outer region, an inner memory cell string including second memory cells connected to an inner pillar extending vertically upward through the inner region, and data input/output (I/O) circuit. The method includes sensing a data set stored in at least one of the first memory cells and the second memory cells, sampling the data set to determine a plurality of candidate read voltages, and selecting one of the candidate read voltages as a first optimal read voltage to read the first memory cells, and selecting one of the candidate read voltages as a second optimal read voltage to read the second memory cells.

BRIEF DESCRIPTION OF THE DRAWINGS

The above and other aspects and features of the inventive concept will become more apparent upon consideration of certain exemplary embodiments illustrated in accompanying drawings, in which.

DETAILED DESCRIPTION

Various memory devices and methods of reading data from such memory devices will be described with reference to the accompanying drawings. The illustrated embodiments are presented as teaching examples. The scope of the inventive concept is defined by the claims that follow and their equivalents. Those skilled in the art will recognize that modifications to the illustrated embodiments as possible without removing same from the scope of the inventive concept.

Figure (FIG.) 1 is a block diagram illustrating a memory system according to embodiments of the inventive concept.

Figure 1:
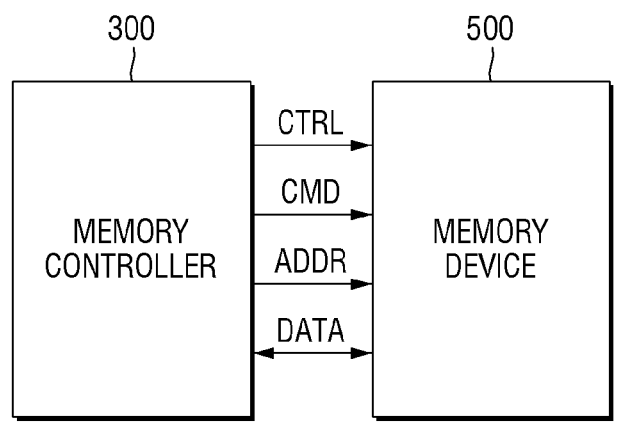
FIG. 1 is a block diagram illustrating a memory device 500 according to embodiments of the inventive concept.

Referring to FIG. 1, a memory system 100 may generally include a memory controller 300 and at least one memory device 500.

The memory device 500 may perform (or execute) various data access operations, including read, write, and erase operations under the control of the memory controller 300. For example, during a read operation the memory controller 300 may provide one or more control signal(s) CTRL, command(s) CMD, address(es) ADDR to the memory device 500 in order to retrieve data stored in the memory device 500 DATA. During a write (or program) operation the memory controller 300 may provide one or more control signal(s) CTRL, command(s) CMD, address(es) ADDR to the memory device 500, as well as write data to be stored in the memory device 500 DATA.

Figure 2:
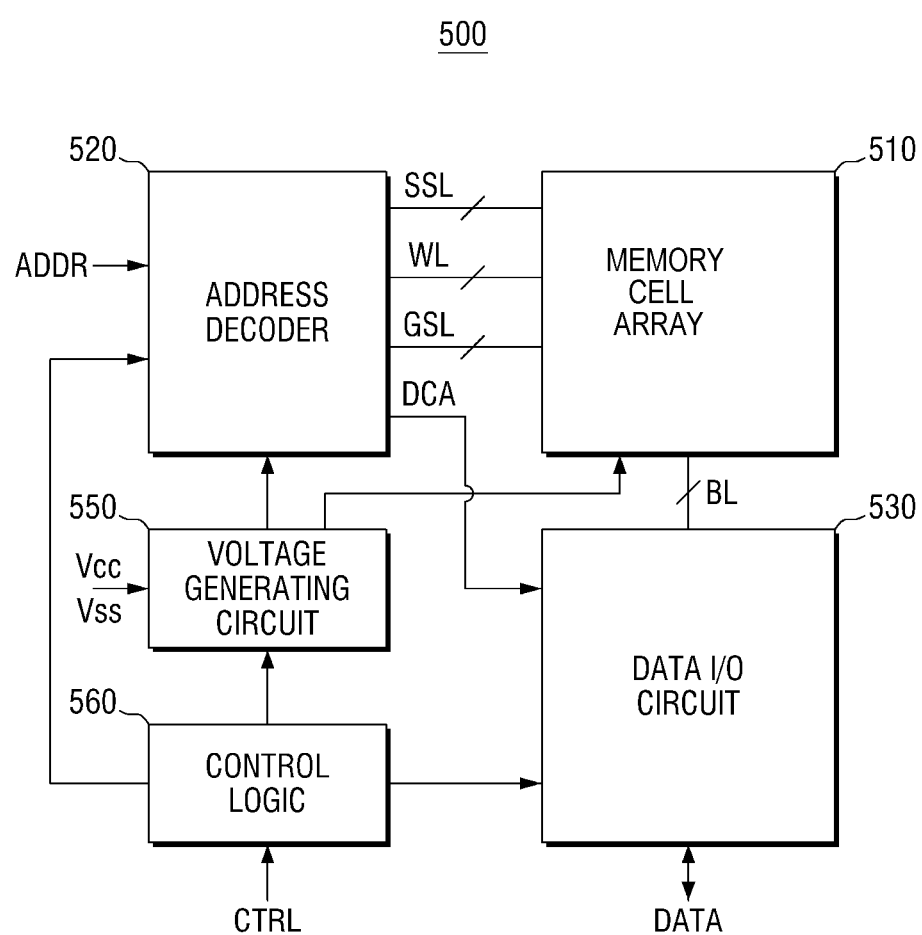
FIG. 2 is a block diagram further illustrating in one embodiment the memory device 500 of FIG. 1.

FIG. 2 is a block diagram further illustrating the memory device 500 of FIG. 1 in one particular embodiment.

Referring to FIG. 2, the memory device 500 includes a memory cell array 510, an address decoder 520, a data input/output (I/O) circuit 530, a voltage generating circuit 550, and control logic 560.

The memory cell array 510 may be connected to the address decoder 520 via word lines WL and selection lines, such as string selection lines SSL and ground selection lines GSL. The memory cell array 510 may also be connected to the data I/O circuit 530 via bit lines BL.

As will be appreciated by those skilled in the art, the memory cell array 510 may include a vast plurality of memory cells arranged according to rows and columns. Each memory cell may be configured to store single-bit data or multi-bit data. In certain embodiments of the inventive concept, the memory cell array 510 may be a vertical NAND flash memory of the type described hereafter in relation to FIGS. 3, 4 and 5.

The address decoder 520 may be configured to operate in response to control signal(s) provided by the control logic 560 and/or an externally provided address ADDR (e.g. a row address). Assuming that the address decoder 520 is configured to decode an externally provided row address ADDR, the address decoder 520 may select a word line identified by a decoded row address from among the plurality of word lines WL. The address decoder 520 may be further configured to select various selection lines (e.g., string selection lines SSL and/or ground selection lines GSL) in response to the decoded row address.

In this regard, the address decoder 520 may be further configured to provided various voltages received from the voltage generating circuit 550 in order to select/unselect word line(s) and/or selection lines.

The address decoder 520 (or alternately, another separately provided address decoder) may be used to decode a column address received as part of the externally provided address ADDR. Here, the address decoder 520 may provide a decoded column address DCA to the data I/O circuit 530. Hence, in certain embodiments of the inventive concept, the address decoder 520 may include a row decoder for decoding a row address, a column decoder for decoding a column address, and an address buffer for storing a received address ADDR.

The data I/O circuit 530 may alternately be used to output read data retrieved from the memory cell array 510 during a read operation to an external device, or receive write (or program) data to be written to the memory cell array 510 from an external device. In either mode of operation the data I/O circuit 530 may operate in response to one or more control signals provided by the control logic 560, as well as the decoded address signals DCA provided by the address decoder 520. In this regard, the data I/O circuit 530 may select one or more bit lines BL in response to the decoded address signals DCA and control signals provided by the control logic 560.

The data I/O circuit 530 may be variously configured and may include elements such as a page buffer (or page register), a detection amplifier, a write driver, a column selection circuit, etc., in order to exchange data with one or more external device(s).

The voltage generating circuit 550 may be connected to the memory cell array 510, address decoder 520, and control logic 560. The voltage generating circuit 550 receives externally provided power signals (e.g., power voltage Vcc and ground voltage Vss), and generates various control voltages from the power signals in response to control signals received from the control logic 560. Those skilled in the art will recognize that control voltages commonly used during read/write operations include a high voltage Vpp, a program voltage Vpgm, a pass voltage Vpass, a read voltage Vread, and an erase voltage Vers.

The control voltages generated by the voltage generating circuit 550 are variously and selectively provided to the address decoder 520 and memory cell array 510 under the control of the control logic 560. For example, the program voltage Vpgm and pass voltage Vpass may be provided to the memory cell array 510 through the address decoder 520 during a program operation; the read voltage Vread may be provided to the memory cell array 510 through the address decoder 520 during a read operation; and the erase voltage Vers may be provided to the memory cell array 510 during an erase operation. However, these are merely convenient examples of many different control voltages that may be generated by the voltage generating circuit 550 during one or more data access operations.

As noted above, the control logic 560 may be connected to the address decoder 520, data I/O circuit 530, and voltage generating circuit 550 in order to control the operation and inter-operation of these components and others within the memory device 500. The control logic 560 may control the overall operation of the memory device 500 in response to the one or more, externally provided control signal(s) CTRL.

Figure 3:
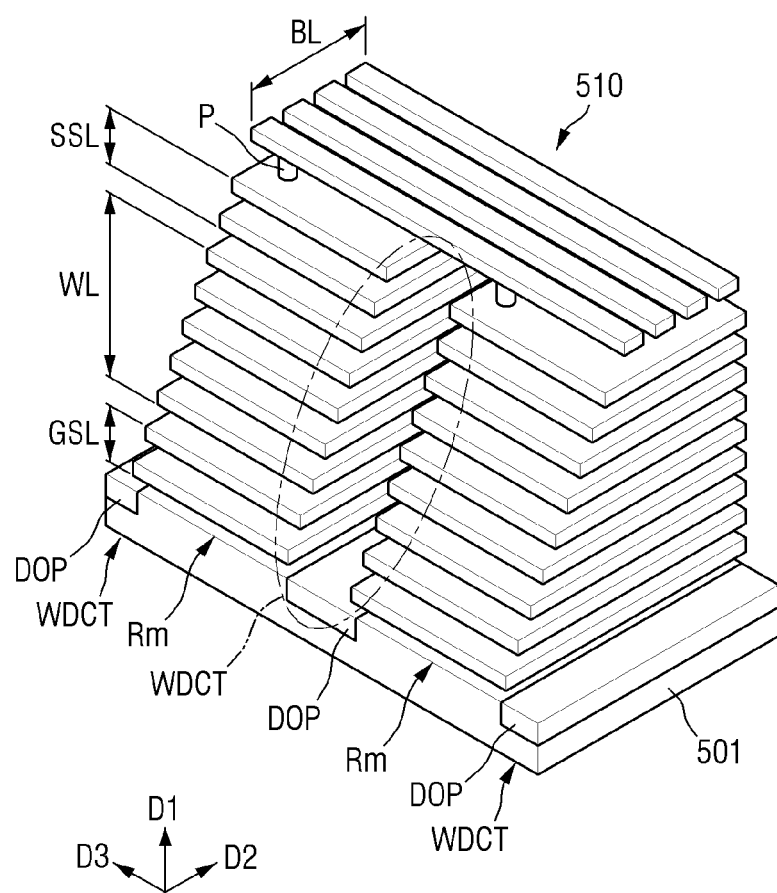
FIG. 3 is a perspective view further illustrating in one example the memory cell array 510 of FIG. 2.

FIG. 3 is a perspective view illustrating in one example the memory cell array 510 of FIG. 2 as a vertical NAND memory structure.

Referring to FIG. 3, the first direction D1 is assumed to be a vertical direction, the second direction D2 is assumed to be a first horizontal direction intersecting the vertical direction D1, and the third direction D3 is assumed to be a second horizontal column direction intersecting the vertical direction D1 and the first horizontal direction D2. Here, the vertical direction D1, first horizontal direction D2, and the second horizontal direction D3 are substantially and respectively orthogonal to one another.

The memory cell array 510 may include a plurality of word lines WL vertically stacked on a substrate 501 between at least one ground string line GSL and at least one string selection line SSL. Different vertical word lines WL stacks may be separated by word line cut regions WDCT. Various doping regions DOP may be formed in the word line cut regions on the substrate and may be used as a common source node or a common source line CSL through which a common source voltage is provided.

A plurality of vertical channels or channel holes pass through the at least one ground string line GSL, the plurality of word lines WL, and the at least one string selection line SSL. The bit lines may be connected to an upper surface of the plurality of vertical channels, and bit lines BL may extend in the second horizontal direction D3.

The memory cell array 510 may effectively be divided into a plurality of memory cell array regions Rm by the word line cut regions WDCT. In this regard, the respective memory cell array regions (or memory groups) Rm may be physically separated and electrically isolated from one another by the word line cut region partitioning.

Figure 4:
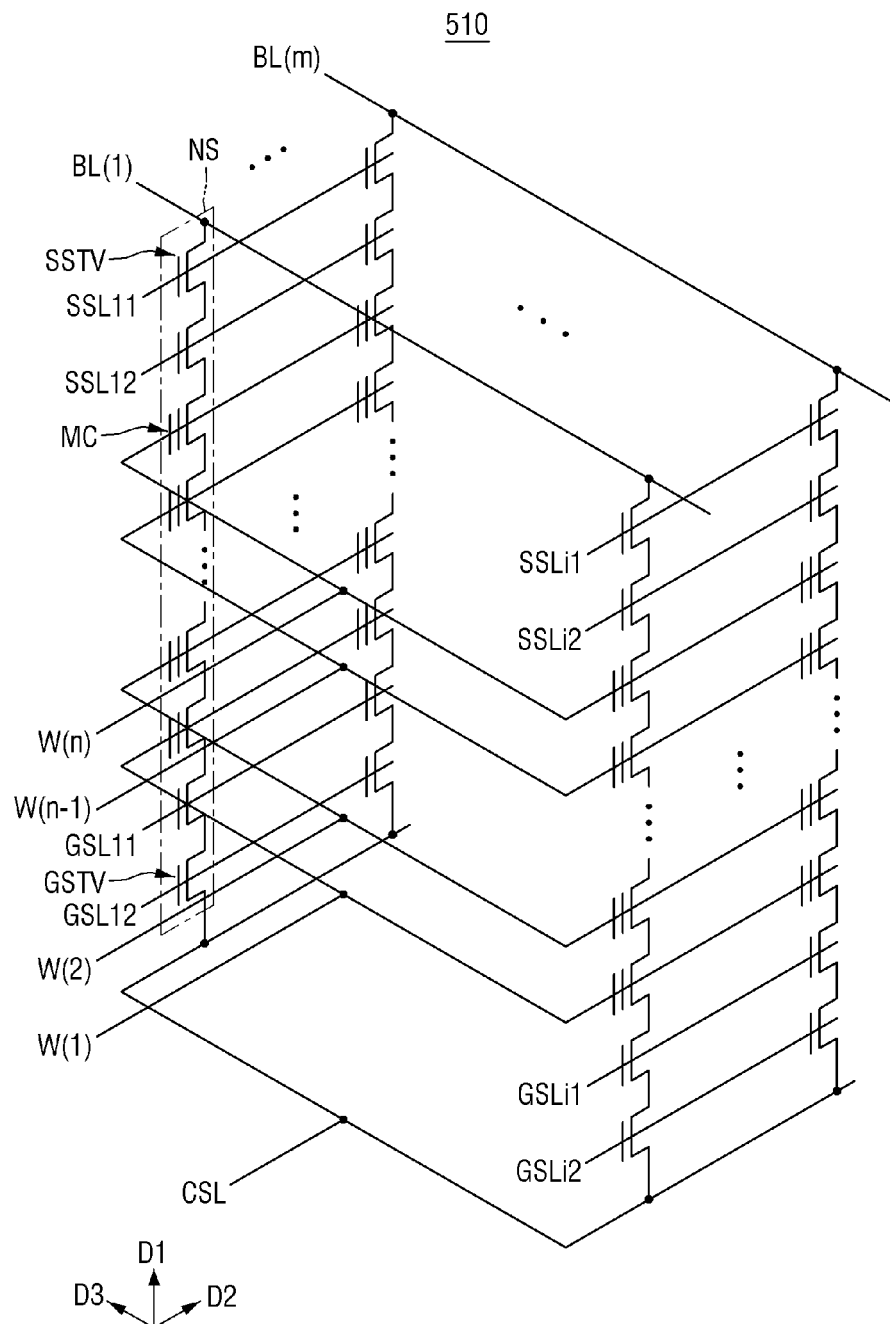
FIG. 4 is an equivalent circuit diagram for the memory cell array 520 of FIGS. 1, 2 and 3.

FIG. 4 is an equivalent circuit diagram for relevant portions of the memory cell array 520 of the memory device 500 of FIGS. 2 and 3.

Referring to FIG. 4, the memory cell array 510 may include a plurality of NAND memory cell strings NS, each extending in the vertical direction D1. (Hereafter, the term "memory cell string" is used to refer to elements of a vertical memory cell array connecting multiple memory cells and extending substantially in the vertical direction, regardless of memory cell type—e.g., flash, resistive, magnetic, etc.). A number of NAND strings NS may be arranged in the first horizontal direction D2 to form a string column, and a number of string columns may be arranged in the second horizontal direction D3 to form a string array.

Each NAND string in FIG. 4 includes at least one ground selection transistor GSTV, memory cells MC, and at least one string selection transistor SSTV arranged in series between the common source line CSL and the bit lines BL(1), . . . , BL(m) in the vertical direction D1. The ground selection transistors GSTV may be connected to ground selection lines GSL11, GSL12, . . . , GSLi1, GSLi2), and the string selection transistors SSTV may be connected to string selection lines SSL11, SSL12, . . . , SSLi1, SSLi2.

The memory cells MC arranged in the same layer may be connected in common to one of the word lines WL(1), WL(2), . . . , WL(n-1), WL(n). The plurality of ground selection lines GSL11, . . . , GSLi2 and the plurality of string selection lines SSL11, . . . , SSLi2 may extend in the first horizontal direction D2 and may be arranged in the second horizontal direction D3. The plurality of word lines WL(1), . . . , WL(n) may extend in the first horizontal direction D2 and may be arranged in the vertical direction D1 and the second horizontal direction D3. The plurality of bit lines BL(1), . . . , BL(m) may extend in the second horizontal direction D3 and may be arranged in the first horizontal direction D2. The memory cells MC2 may be controlled according to the level of a voltage applied to the word lines WL(1), . . . , WL(n).

A vertical or a three-dimensional (3D) NAND flash memory device including the memory cell array 510 includes NAND flash memory cells, and thus executes a write/read operations according to page-sized units, while performing erase operations according to block-sized units.

In some embodiments, two string selection transistors SSTV included in one string NS may be connected to one string selection line, and two ground selection transistors GSTV included in one string NS may be connected to one ground selection line. In some embodiments, one string may include one string selection transistor SSTV and one ground selection transistor GSTV.

Figure 5:
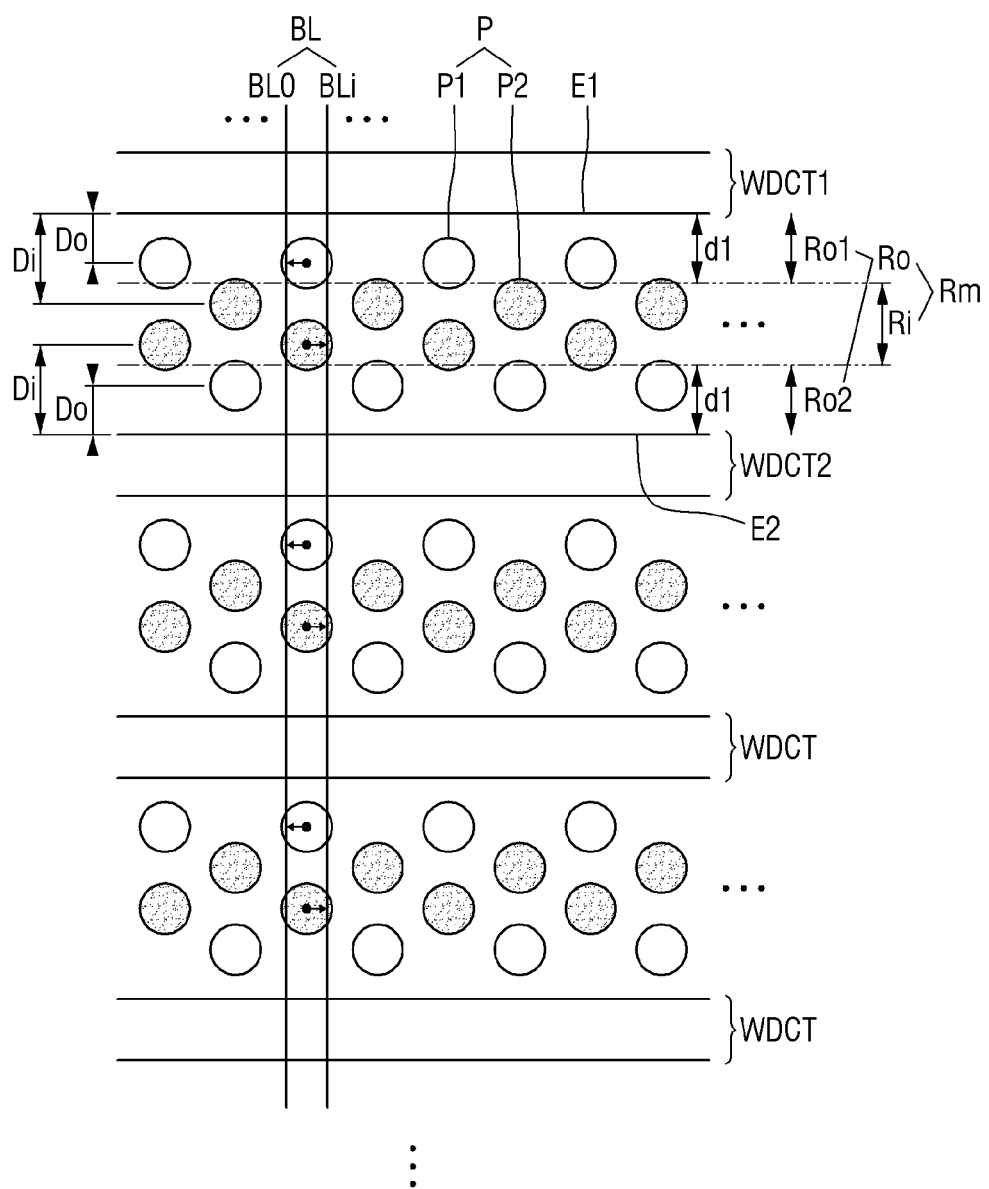
FIG. 5 is a plan view further illustrating in one example the memory cell array 510 of FIGS. 1, 2 and 3.

FIG. 5 is a plan view further illustrating certain embodiments of the inventive concept wherein the memory cell array 510 includes a plurality of vertically (i.e., the vertical direction D1) arranged pillars P variously connected to bit lines extending in the second horizontal direction D3. The memory cell array 510 described hereafter in the context of FIG. 5 may be used the embodiments previously described in relation to FIG. 2 and FIG. 3 (e.g., as a memory cell array Rm).

Referring to FIGS. 3, 4 and 5, common source lines corresponding to the doping regions DOP may be arranged inside respective word line cut regions WDCT. Hence, each memory cell array region Rm may include an inner region Ri bracketed by opposing outer regions Ro1 and Ro2. Here, each outer region Ro1 and Ro2 may be defined as a region extending a separation distance 'd1' from a respective end E1, E2 of the memory cell array Rm towards a inner region Ri. Therefore, the inner region Ri may be understood as a region of the memory cell array RM disposed between opposing outer regions Ro1 and Ro2, and the inner region Ri may further be understood in certain embodiments of the inventive concept as a region spaced at least the first distance d1 from either one of the first end E1 and second end E2.

In the illustrated example of FIG. 5, the memory cell array region Rm has a first end E1 and an opposing second end E2, where the first end E1 is proximate a first word line cut WDCT1 and the opposing second end E2 is proximate a second word line cut WDCT2. Each word line cut extends in the first horizontal direction D2 and each arrangement of first outer/inner/second outer regions extends in the second horizontal direction D3.

Pillars P extending vertically down (in the vertical direction D1) through the inner region Ri and outer regions Ro1 and Ro2 may be formed in a variety of patterns or geometries consistent with memory device performance expectations. For example, as illustrated in FIG. 5 the pillars P may be formed in a row-wise, zig-zag pattern, where alternating rows in the second horizontal direction D3 are offset in the first horizontal direction D2. Such a zig-zag pattern allows reduction in the overall size of the memory cell array Rm in at least one of the second and third directions D2 and D3, and will hereafter be referred to as a "staggered-row arrangement".

In the context of their respective disposition with respect to the inner region Ri and outer regions Ro1 and Ro2, each pillar P may be identified as an outer pillar P1 (or first pillar P1) or an inner pillar P2 (or second pillar P2). That is, outer pillars P1 are disposed in an outer region Ro, and inner pillars P2 are disposed in the inner region Ri. Here, the expression disposed in (or alternately formed in) denotes the location of pillar P center. Hence, a pillar having its center disposed in the inner region Ri will be an inner pillar P2, and a pillar having its center disposed in an outer region will be an outer pillar P1. However, portions of some pillars, other than their respective center, may be disposed in both an outer region Ro and the inner region Ri.

Each row of pillars in the foregoing description extends in the first horizontal direction D2. Thus, in the illustrated example of FIG. 5, two rows of inner pillars are arranged in the inner region Ri, one row of outer pillars P1 is arranged in the first outer region Ro1, and another row of pillars P1 is arranged in the second outer region Ro2 for a total of four rows of pillars P arranged in the first horizontal direction D2. In certain embodiments of the inventive concept, each and every pillar in the memory device 500 may be identically formed, regardless disposition in an inner region or outer region.

Referring again to FIG. 5, each outer pillar P1 in the first outer region Ro1 may be separated by a first distance Do from the first end E1, and each outer pillar P1 in the second outer region Ro2 may be separated by the first distance Do from the second end E2. In contrast, each inner pillar P2 may be separated by at least a second distance Di, greater than the first distance Do, from both of the first outer region Ro1 and second region Ro2.

It should be noted here that the number of pillars P, the number of inner and outer pillar rows, the arrangement of pillar rows shown in FIG. 5 are merely exemplary. Other pillar configurations are possible in other embodiments of the inventive concept. For example, two outer rows of pillars P1 may be arranged each outer region Ro, only a single outer region Ro may be provided with a single inner region Ri, four rows of inner pillars P2 may be arranged in the inner region Ri, a symmetrically arrangement of pillar rows may be provided, etc.

Again referring to FIG. 5 the bit lines BL of the memory device 500 may include a first bit line BLo and a second bit line BLi. The first bit line BLo and the second bit line BLi may be adjacently disposed to form paired bit lines extending in the second horizontal direction D3. The first bit line BLo and the second bit line BLi are spaced apart in the first horizontal direction D2. For the sake of clarity, only a single pair of bit lines (i.e., first bit line BLo and second bit line BLi) are shown in FIG. 5.

With this configuration, each outer (or first) pillar P1 may be electrically connected to a corresponding first bit line BLo, and each inner (or second) pillar P2 may be electrically connected to a corresponding second bit line BLi. However, these bit line-to-pillar connection relationships may be reversed if appropriate.

Embodiments of the inventive concept like the memory devices described in relation to the foregoing figures provide marked performance advantages over conventional memory devices. For example, conventional non-volatile memory devices including a vertical memory cell array treat the reading of data from memory cell strings having an inner pillar in the same manner as the reading of data from memory cell strings having an outer pillar, despite the fact that inner pillar-memory cell strings and outer pillar-memory cell strings in the same memory cell array may exhibit different performance characteristics. Accordingly, embodiments of the inventive concept are better able to compensate for process variations that may occur in relation to inner pillar memory cell strings and outer pillar memory cell strings.

In this regard, embodiments of the inventive concept may further refine the execution of read operations by determining a more appropriate, and thus potentially different, read voltages that may be respectively applied to the outer pillar memory cell strings verses inner pillar memory cell strings.

In earlier generations of NAND flash memory, for example, read reference voltage values (hereafter, read voltage) were fixed during design. However, several types of read data errors were caused by the shifting of memory cell threshold voltage distribution(s). To compensate for shifts in the memory cell voltage distribution a class of mechanisms, generally referred to as read-retry, have been implemented in more modern flash memory devices. The read-retry approach allows the read voltage to be dynamically adjusted in response to shifts in the memory cell voltage distribution(s). During read-retry, a memory controller may initially read data from target memory cells of a memory cell array using a default read voltage. If the resulting read data is acceptable (e.g., if it can be successfully corrected by a constituent error detection and correction mechanism), then the default read voltage is deemed appropriate. However, if the resulting read data is not acceptable, the memory controller may re-read the target memory cells using a read voltage different from the default read voltage. The memory controller may repeat these steps until it successfully reads the data using one or more read voltages. Possible read voltages that may be selected and used by a memory controller during read-retry may be referred to as candidate read voltages.

It should be noted, however, that repeated read-retry attempts may significantly increase the overall read operation latency. Hence, mechanism that reduce the number of read-retry attempts while taking advantage of the effective capabilities of read-retry are highly desirable.

Figure 6:
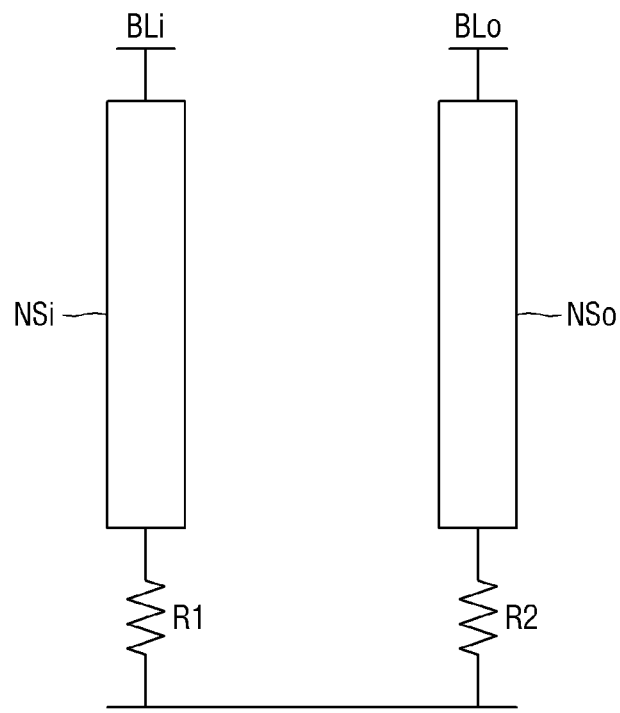
FIG. 6 is a conceptual circuit diagram further illustrating certain connection relationships for NAND strings in the memory cell array of FIG. 5.

FIG. 6 is a conceptual circuit diagram further illustrating the plurality of NAND memory cell strings of the memory cell array 510 of FIGS. 4 and 5.

Referring to FIGS. 4, 5 and 6, the plurality of NAND memory cell strings includes both inner NAND strings NSi and outer NAND strings, where each inner NAND string includes an inner (or second) pillar P2, and each outer NAND string NSo includes an outer (or first) pillar P1.

Each inner NAND string NSi may be conceptually understood as having one end connected to an inner (or second) bit line BLi and the other end connected to the common source line CSL through an inner resistor R1 having a first resistance value. Each outer NAND string NSo may be conceptually understood as having one end connected to an outer (or first) bit line BLo and the other end connected to the common source line CSL through an outer resistor R2 having a second resistance value.

As described above with reference to FIG. 3, since the second distance Di between each inner NAND string NSi (including an inner or second pillar P2) and the common source line (i.e., the word line cut region) is greater than the first distance Do between each outer NAND string NSo (including an outer or first pillar P1) and the common source line, and the first resistance value of the inner resistor R1 may be greater than the second resistance value of the outer resistor R2. That is, the overall performance characteristics of each inner NAND string NSi may be different from the overall performance characteristics of each outer NAND string NSo, and therefore, the resulting asymmetric connection structures—as between the inner NAND strings NSi and the outer NAND strings NSo—may yield different data results in response to the use of a single read voltage during a read operation.

Figure 7:
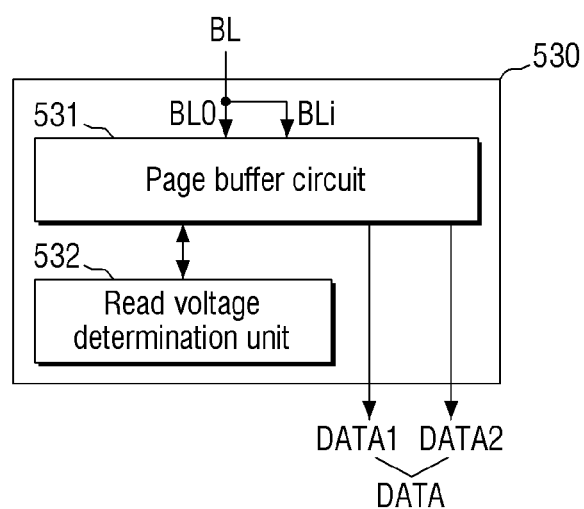
FIG. 7 is a block diagram further illustrating in one example the data I/O circuit of FIG. 2.

FIG. 7 is a block diagram further illustrating in one embodiment the data I/O circuit 530 of FIG. 2.

With reference to FIGS. 4, 5, 6 and 7 and as will be described in some additional detail hereafter, the data I/O circuit 530 may include a page buffer circuit 531 that may be used to selectively connect the first bit line BLo during a first read operation directed to memory cells of an outer memory cell string, and to selectively connect the second bit line BLi during a second read operation directed to memory cells of an inner memory cell string. In this context, an "outer memory cell string" is a memory cell string including memory cells connected to an outer pillar P1, and an "inner memory cell string" is a memory cell string including memory cells connected to an inner pillar P2. The data I/O circuit 530 may further include a read voltage determination unit 532 that may be used to identify (or "select") a first optimal read voltage to be used during the first read operation, and to select a second optimal read voltage to be used during the second read operation. Here, the first and second read operations may be understood as being independently controlled at least in so far as an relatively optimal read voltage may be dynamically selected as a reference read voltage during the corresponding read operation. Nonetheless, the first read operation and second read operation in this regard may be performed together (or simultaneously), sequentially, or at different times.

Hence, the data I/O circuit 530 may generally include a page buffer circuit 531 and a read voltage determination unit 532.

Figure 8:
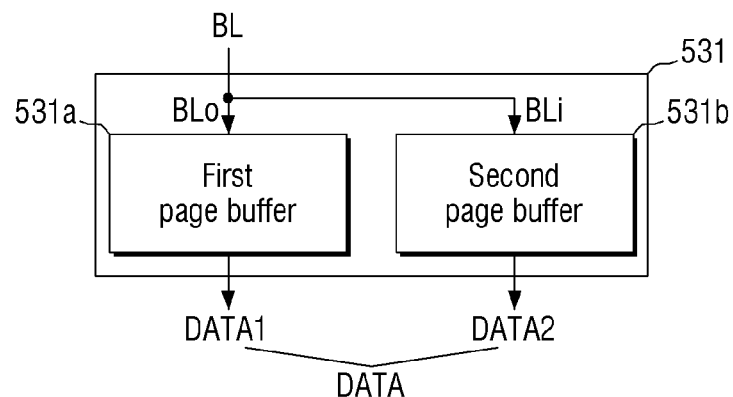
FIG. 8 is a block diagram further illustrating in one example the page buffer structure 531 of FIG. 7.

The page buffer circuit 531 may include multiple page buffers, as further illustrated in one example in FIG. 8. For the sake of clarity, examples are presented herein where respective page buffers connect a single bit line BL, but this need not always be the case. The page buffer circuit 531 may receive data from the first bit line BLo and/or the second bit line BLi, and may output data, where the DATA may include first data DATA1 and/or second data DATA2.

The first data DATA1 may be data read (e.g., during a first read operation) from an outer NAND string including memory cells connected to an outer (or first) pillar P1, and the second data DATA2 may be data read (e.g., during a second read operation) from memory cells connected to an inner NAND string including an inner (or second) pillar P2. That is, the first data DATA1 and the second data DATA2 may be data respectively associated with data communicated via the first bit line BLo and the second bit line BLi, respectively.

The read voltage determination unit 532 may be used to determine an optimal read voltage (Vread) in order to most accurately obtain the first data DATA1 and/or the second data DATA2.

FIG. 8 is a block diagram further illustrating in one embodiment the page buffer circuit 531 of FIG. 7.

Referring to FIG. 8, the page buffer circuit 531 may include a first page buffer 531a and a second page buffer 531b, where the first page buffer 531a may be a combination of one or more page buffers, each respectively connected to a first bit line BLo. Hence, in certain embodiments of the inventive concept, the first page buffer 531a may include a first group of page buffers, each respectively connected to receive first data DATA1 from an inner NAND string including an inner (or second) pillar P2. Likewise, in certain embodiments of the inventive concept, the second page buffer 531b may include a second group of page buffers, each respectively connected to receive second data DATA2 from an outer NAND string including an outer (or second) pillar P1.

The first page buffer 531a may therefore be used to output the first data DATA1 through the one or more first bit lines BLo, and the second page buffer 531b may output the second data DATA2 through the one or more second bit line BLi.

Figure 9:
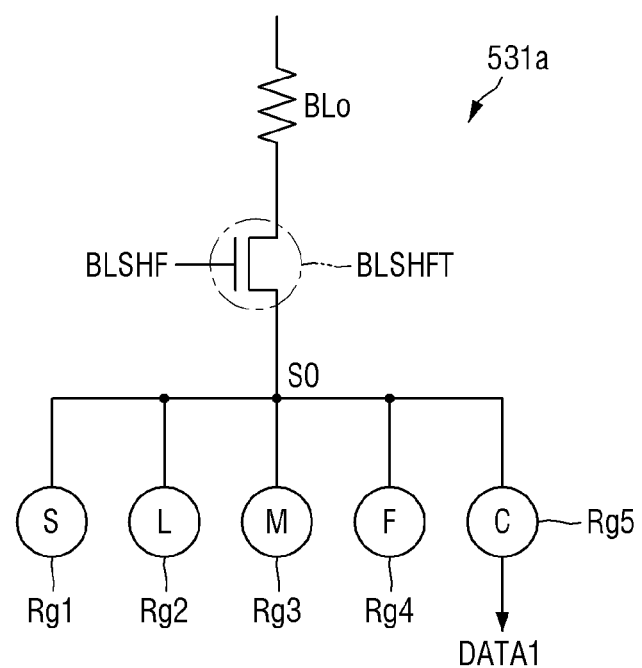
FIGS. 9 and 10 are respective conceptual circuit diagram illustrating the first page buffer and second page buffer of FIG. 8.

FIG. 9 is a conceptual circuit diagram further illustrating in one embodiment the first page buffer 531a of FIG. 8. In FIG. 9, for the sake of clarity, the first bit line BLo is represented by an equivalent resistor BLO.

Referring to FIG. 9, each one of the one or more page buffers included within the first page buffer 531a may be connected to the first bit line BLo and may include a bit line shut-off transistor BLSHFT, a sensing node SO, a first register Rg1 (S), a second register Rg2 (L), a third register Rg3 (M), a fourth register Rg4 (F), and a fifth register Rg5 (C). Here, the first register Rg1 (S) may be used as a sensing register; the second register Rg2 (L) may be used a first storing register associated, for example, with a Least significant data bit; and third register Rg3 (M) may be used as a second storing register associated, for example, with a Most significant data bit; the fourth register Rg4 (F) may be used as a third storing register associated, for example, with a Forcing bit; and the fifth register Rg5 (C) may be used as a data latch (or cache) register. Hence, with this configuration, the fifth register Rg5 may be used to store a data-to-be output—provided as the first data DATA1. Here, the respective storing registers Rg2, Rg3 and Rg4 may be used to store a particular candidate read voltage. In this context, those skilled in the art will understand that each one of storing registers may be used to store a data value indicating a corresponding read voltage (hereafter, simply referred to as "storing a candidate read voltage"). During the execution of a read operation, the read voltage determination unit 532 and/or the control logic 560 may be used to select one of the stored candidate read voltages as an optimal read voltage for reading a particular data set.

The first bit line BLo may be connected to the sensing node SO through the bit line shut-off transistor BLSHFT that is controlled in its operation by a bit line shut-off signal BLSHF applied (e.g., as a gate signal.

Generally speaking, the reading of a target memory cell (e.g., a memory cell identified by an externally provided address) may be referred to sensing the memory cell. Again assuming the operational context of a NAND flash memory device, the sensing of a memory cell involves an initialization step (Initialize), a pre-charging step (Pre-charge), a bit line developing step (BL Develop), an offset developing step (SO Develop), and a sensing step (Sensing), where in certain embodiments of the inventive concept, the bit line developing step and the offset developing step may be performed simultaneously.

During the initialization step (Initialize), the first register Rg1 (i.e., the sensing latch) may be initialized.

During the pre-charging step (Pre-charge), the sensing node SO may be charged to a predetermined voltage level. Here, the voltage level of the bit line shut-off signal BLSHF may transition to a pre-charge voltage and the first bit line BLo connected to the sensing node SO may be charged to the predetermined voltage level.

During the developing step (BL Develop), the pre-charging of the first bit line BLo ends. Here, the bit line shut-off signal BLSHF may transition to a developing voltage lower than the pre-charge voltage, yet higher than ground voltage. Electrical charge from the first bit line BLo may be retained or released to the common source line CSL depending on the ON/OFF state of a target memory cell. Accordingly, the voltage of the first bit line BLo may further decrease when the memory cell MC is turned ON, relative to the voltage retained by the first bit line BLO when the memory cell MC is turned OFF.

Where the bit line shut-off transistor BLSHFT is implemented using a single transistor, the pre-charging step and developing step will be controlled through the single transistor. Thus, it is possible to minimize mismatch between transistors compared cases wherein the pre-charging step and the developing step are separately controlled using a plurality of transistors. However, it will be appreciated by those skilled in the art that the NAND flash memory device assumed in this example invention may include a plurality of transistors implementing the bit line shut-off transistor for the purpose of precise control.

During the sensing step (Sensing), the ON/OFF state of the target memory cell MC may be determined depending on whether the first register Rg1 is flipped. In this case, when the pre-charging step has switched into the developing step, the bit line shut-off signal BLSHF may decrease from the pre-charge voltage to the developing voltage for a certain time period. In this case, when the certain time period is defined to be a developing time, a result of determining the state of the memory cell MC may change depending on the developing time. The change of the developing time may be regarded as the change of an effective read level, as if the read level is changed. That is, the effective read level may increase when the developing time is shortened and may decrease when the developing time is lengthened.

Accordingly, certain memory devices according to embodiments of the inventive concept may define a plurality of effective read levels as a plurality of candidate read voltages according to respective developing times. Memory cell sensing may then be performed several times during a single extended developing time.

The read voltage determination unit 532 of FIG. 7 may thus be used to determine a plurality of candidate read voltages, and may further be used to determine an optimal read voltage from among the plurality of candidate read voltage. Accordingly, data associated with the plurality of candidate read voltages may be stored in the various registers of the first page buffer 531a. The read voltage determination unit 532 may receive the data and find the optimal read voltage from among the plurality of candidate read levels.

For example, each one of the second register Rg2, the third register Rg3, and the fourth register Rg4 may be a register for storing data according to a corresponding candidate read voltage. That is, in the context of the illustrated example of FIG. 9, three (3) data values may be obtained according to three sensing operation performed at different points during a developing time. These three data values may be stored in the second register Rg2, the third register Rg3, and the fourth register Rg4, respectively.

The read voltage determination unit 532 may be variously implemented and may include, for example, a mass bit counter circuit or a current comparator. In this regard, the subject matter of U.S. Pat. Nos. 8,773,908 and 9,007,839 is hereby incorporated by reference. However, specifically configured, the read voltage determination unit module 532 may be used to determine (or calculate) the data stored in the second register Rg2, the third register Rg3, and the fourth register Rg4 included in the plurality of first page buffers 531a to select an optimal read voltage from among the candidate read voltages.

Figure 10:
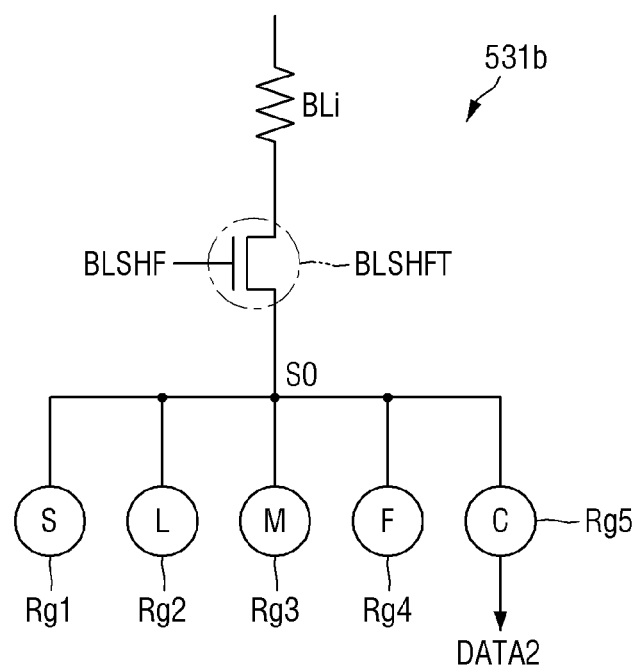

FIG. 10 is another conceptual circuit diagram further illustrating in one embodiment the second page buffer 531b of FIG. 8. In FIG. 10, for the sake of clarity, the second bit line BLi is represented by an equivalent resistor BLi.

Referring to FIG. 10, any one of the second page buffers 531b may have a similar structure to a page buffer of the first page buffer 531a. That is, the second page buffer 531b may include the second bit line BLi, the bit line shut-off transistor BLSHFT, the sensing node SO, the first register Rg1, the second register Rg2, the third register Rg3, the fourth register Rg4, and the fifth register Rg5.

Here, the second bit line BLi may correspond to the first bit line BLo, and the remaining elements may perform the same function as the first page buffer 531a. That is, the second page buffer 531b may store data corresponding to the plurality of candidate read voltages stored while changing the developing time, even with respect to the second bit line BLi. The read voltage determination unit 532 may be used to determine data corresponding to the plurality of candidate read voltages in the plurality of second page buffers 531b, and may further be used to find an optimal read voltage from among the plurality of candidate read voltages. Data corresponding to the identified optimal read voltage may then be stored in the fifth register Rg5 and output as the second data DATA2.

In certain embodiments of the inventive concept, the plurality of candidate read voltages stored in the second page buffer 531b (i.e., a second plurality of candidate read voltages) may be identical to the plurality of candidate read voltages (i.e., a first plurality of candidate read voltages) stored in the first page buffer 531a. However, in other embodiments of the inventive concept the first plurality of candidate read voltages may be different from the second plurality of candidate read voltages. In this manner, the first data DATA1 provided by the first page buffer 531a may be independently determined with respect to the second data DATA2 provided by the second page buffer 531b.

Figure 11:
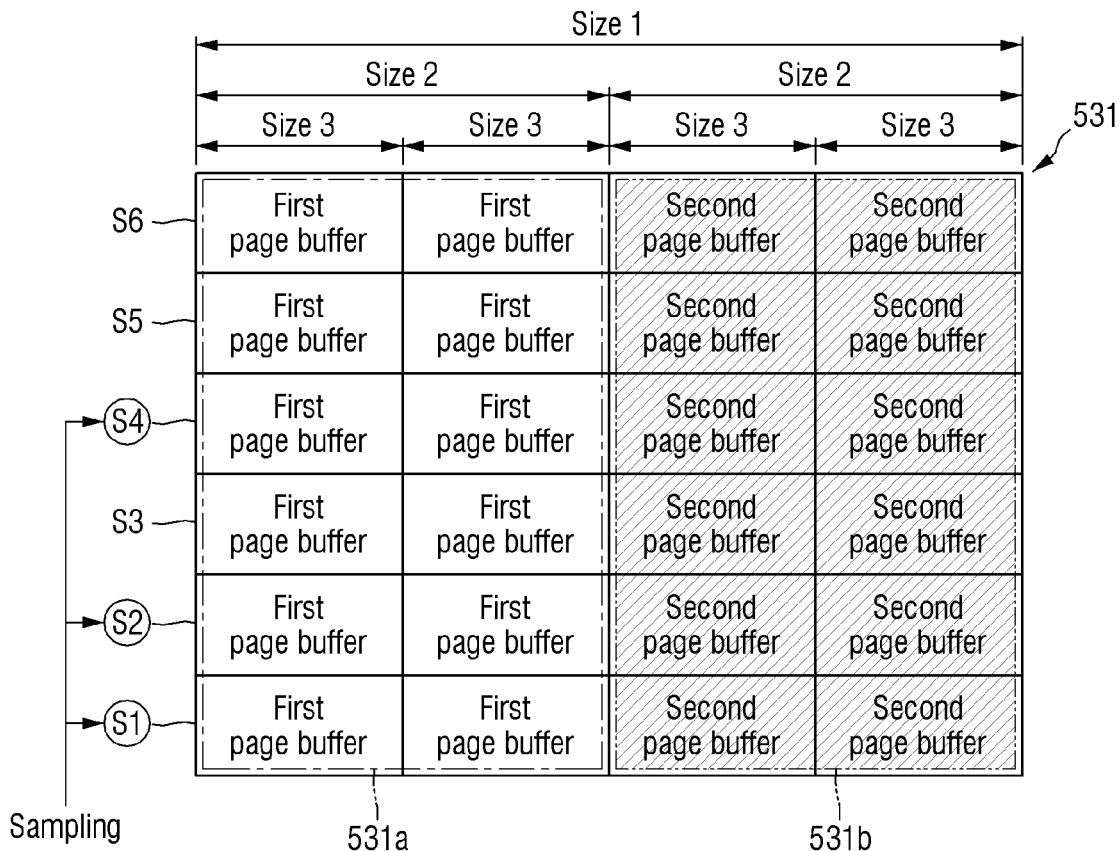
FIGS. 11, 14 and 15 are respective conceptual diagrams illustrating various physical configurations that may be used to implement the page buffer circuit 531 of FIG. 7.

FIG. 11 is a conceptual diagram illustrating one possible physical configuration for the page buffer circuit 531 of FIG. 7.

Referring to FIG. 11, the page buffer circuit 531 is assumed to include first to sixth stages S1 to S6, where the first to sixth stages S1 to S6 have the same first size (e.g., Size 1).

The first size (Size 1) may be a numerical value predetermined according to several constraints such as a physical space limitation in which the page buffer structure 531 can be formed, ease of a wiring structure, and the like. For example, the first size (Size 1) may be 16 KB or 32 KB, but the present invention is not limited thereto.

The first to sixth stages S1 to S6 may be sensed independently in the sensing step. In other words, for example, when the first stage S1 is sensed, the second stage S2 does not necessarily have to be sensed.

In FIG. 11, the first to sixth stages S1 to S6 are shown, but this is merely one example and the scope of the inventive concept is not limited thereto. That is, the number of stages may be 12 or 18. The number of stages may be a standard number that is predetermined according to several constrains such as a stage size.

In one stage, a unit having a third size (Size 3), which is one fourth of the first size (Size 1), may be a minimal unit for determining the type of a page buffer. Here, the type of page buffer indicates whether the page buffer is the first page buffer 531a or the second page buffer 531b. That is, the type of a page buffer indicates whether the page buffer processes first data DATA1 stored in outer memory cell strings NSo including an outer (or first) pillar P1, or second data DATA2 stored in inner memory cell strings NSi including an inner (or second) pillar P2.

Here, a unit having the third size (Size 3) may include a plurality of page buffers. For example, when one bit line contains information of one bit and the third size (Size 3) is 4 KB, 32,768 (=4×1024×8) page buffers may be included in the unit having the third size (Size 3). In this regard, the expression "type of page buffer" indicates whether all the 32,768 page buffers are first page buffers 531a or second page buffers 531b.

In one stage, half columns having the second size (Size 2), each of which is half of the first size (Size 1), may be sensed independently. That is, in the first stage S1, a front part having the second size (Size 2) and a rear part having the second size (Size 2) may be sensed independently and in parallel.

According to the illustrated embodiment of FIG. 11, in the first to sixth stages S1 to S6, the first page buffer 531a may be disposed at a front part having the second size (Size 2), and the second page buffer 531b may be disposed at a rear part having the second size (Size 2).

All of the first to sixth stages S1 to S6 of the page buffer structure 531 may not be used for the sensing. That is, only some of the first to sixth stages S1 to S6 of the page buffer structure 531 may be sampled and used for the sensing.

This may be to increase the speed and efficiency of calculation. That is, when a sufficient amount of data is secured through even some sampling, a relatively accurate data value may be obtained, and therefore the sampling may be performed for higher speed and efficiency.

Accordingly, as an example, only the first stage S1, the second stage S2, and the fourth stage S4 may be sampled to derive data. In this case, all the front parts having the second size (Size 2) of the first stage S1, the second stage S2, and the fourth stage S4 may be the first page buffers 531a, and the rear parts having the second size (Size 2) may be the second page buffers 531b.

Thus, according to this embodiment, the data associated with the first page buffers 531a and the data associated with the second page buffers 531b may be divided into two groups to derive first data and second data.

Figure 12:
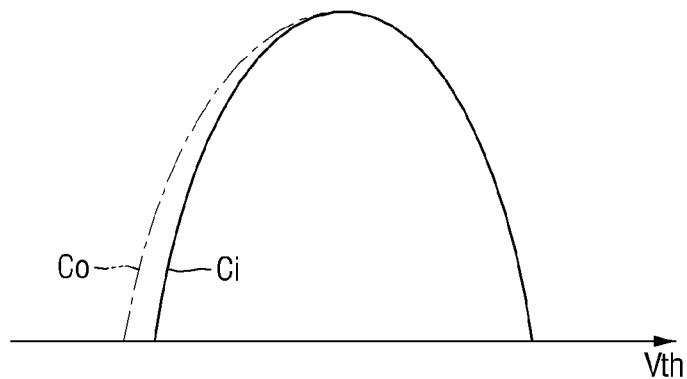
FIG. 12 is scatter diagram for memory cells read results illustrating a difference in characteristics between the first pillar memory cells and second pillar memory cells of FIG. 5.

FIG. 12 is a memory cell threshold voltage distribution chart (or scatter diagram) for certain memory cells and illustrates differences in characteristics between memory cells connected by the outer pillar P1 strings and memory cells connected by the inner pillar P2 strings, where the scatter diagram Co shows data read from outer pillar P1 strings, and the scatter diagram Ci shows data read from inner pillar P2 strings. Here, the manifest differences between the outer pillar P1 string data and the inner pillar P2 string data may result from varying process condition(s) as well as the different relative connection distances between the outer pillar P1 strings and the inner pillar P2 strings and the common source line CSL. Here, the scatter diagram illustrates a relationship between a number of memory cells (along the vertical axis) and a particular memory cell threshold voltage (along the horizontal axis).

In view of the foregoing scatter diagram shifting—which is as a function of the particular pillar type (i.e., inner pillar verses outer pillar) and the corresponding differences in connection structure—the data provided by read operations performed on memory devices according to embodiments of the inventive concept is markedly more accurate than data provided by read operations performed on conventional memory devices, because embodiments of the inventive concept are capable of selecting and using a more optimal read voltage during read operations.

Figure 13:
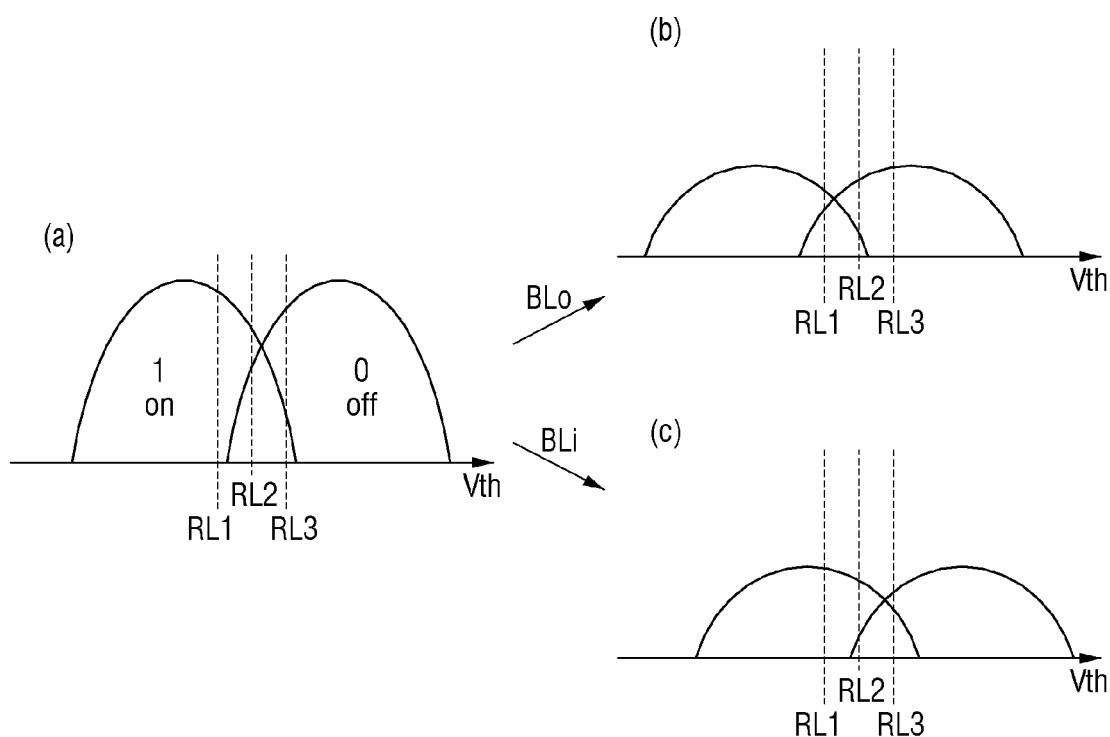
FIG. 13 is a collection of scatter diagrams further illustrating the foregoing.

FIG. 13, inclusive of FIGS. 13($a$), 13($b$) and 13($c$), shows scatter diagrams for two data values read from a memory device according to embodiments of the inventive concept. FIG. 13($a$) shows scatter diagrams of all the memory cells in a memory cell array; FIG. 13($b$) shows scatter diagrams for memory cells connected to outer pillar P1 strings via the first bit line BLo; and FIG. 13($c$) shows scatter diagrams of memory cells connected to inner pillar P2 strings via the second bit line BLi. The respective scatter diagrams of FIG. 13 are similar to the scatter diagram previously described in relation to FIG. 12.

Referring to FIG. 13, an "ON" cell on the left side of FIG. 13($a$) indicates to a number of memory cells storing a data value of "1", and an "OFF" cell on the right side of FIG. 13($a$) indicates a number of memory cells storing a data value of "0". As discussed above, an ON/OFF determination for the respective memory cells may be made with reference to a particular read voltage (Vread). Recognizing the difficulties in the dynamic selection of a relatively optimal read voltage, embodiments of the inventive concept provide a plurality of candidate read voltages from which an optimal read voltage may be selected. Continuing with the working examples described in relation to FIGS. 7, 8, 9 and 10, three (3) candidate read voltage, R1, R2 and R3 are assumed, although any reasonable number of candidate read voltages might be provided by other embodiments of the inventive concept. And as previously mentioned a variety of approaches may be used to define the candidate read voltages (e.g., an approach using a mass bit counter (MSB) circuit, an approach using a current comparator, etc.). For example, the three (3) candidate read voltages RL1, RL2 and RL3 assumed in the previous working examples may be three (3) read voltages derived at different times during an extended developing time period, where the first candidate read voltage RL1 has a lowest level, the third candidate read voltage RL3 has a highest level, and the second read voltage RL2 has an intermediate level between the lowest level and the highest level.

In the scatter diagrams of FIG. 13(a)—which is actually a combination of the scatter diagrams shown in FIG. 13(b) and FIG. 13(c)—the second candidate read voltage RL2 may be identified as the optimal read voltage. In the scatter diagrams of FIG. 13(b), the second candidate read voltage RL2 may be identified as the optimal read voltage, and in the scatter diagrams of FIG. 13(c), the third candidate read voltage RL3 may be identified as the optimal read voltage.

Those skilled in the art will understand that a variety of computational approaches may be used to identify an optimal read voltage for a particular data set, like those data sets conceptually illustrated in the scatter diagrams of FIG. 13. For example, an optimal read voltage may be identified from a plurality of candidate read voltages by adaptively "learning" through data sampling. Here, disparity information (e.g., a ratio of 1's and 0's in the data set) may be used to identify a candidate read voltage yielding the lowest bit error rate indicated by error detection and correction (ECC) capabilities associated with the memory device storing the data set. Alternately or additionally, data sampling may be used to identify a candidate read voltage yielding a shortest read operation latency.

Regardless of the approach used to identify an optimal read voltage from a plurality of candidate read voltages, the inventive concept recognizes that performance characteristics of memory cells connected to outer pillar P1 strings and the performance characteristics of memory cells connected to inner pillar P2 strings may yield varying data sets like those illustrated in FIG. 13. Accordingly, embodiments of the inventive concept are able to dynamically select, as necessary, different optimal read voltages for reading (1) memory cells connected to outer pillar P1 strings, verses (2) memory cells connected to inner pillar P2 strings.

Another memory device according to some embodiments of the present invention will be described below with reference to FIG. 14. What has been described in the above embodiments will be omitted or simplified.

Figure 14:
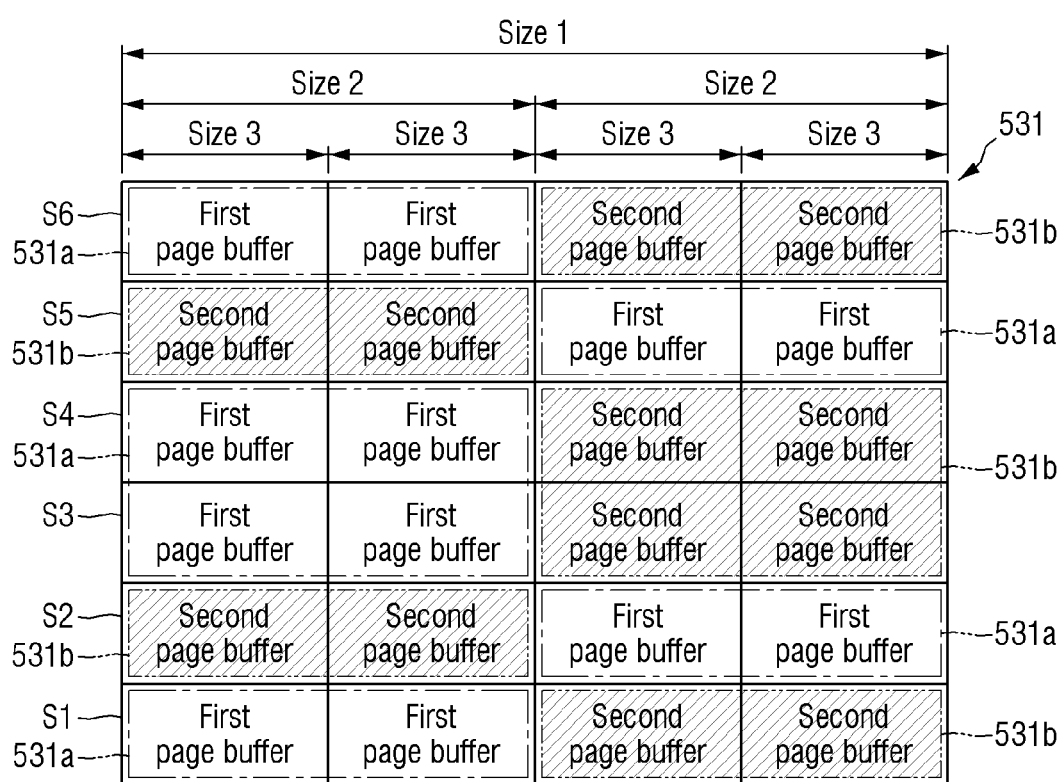
Figure 15:
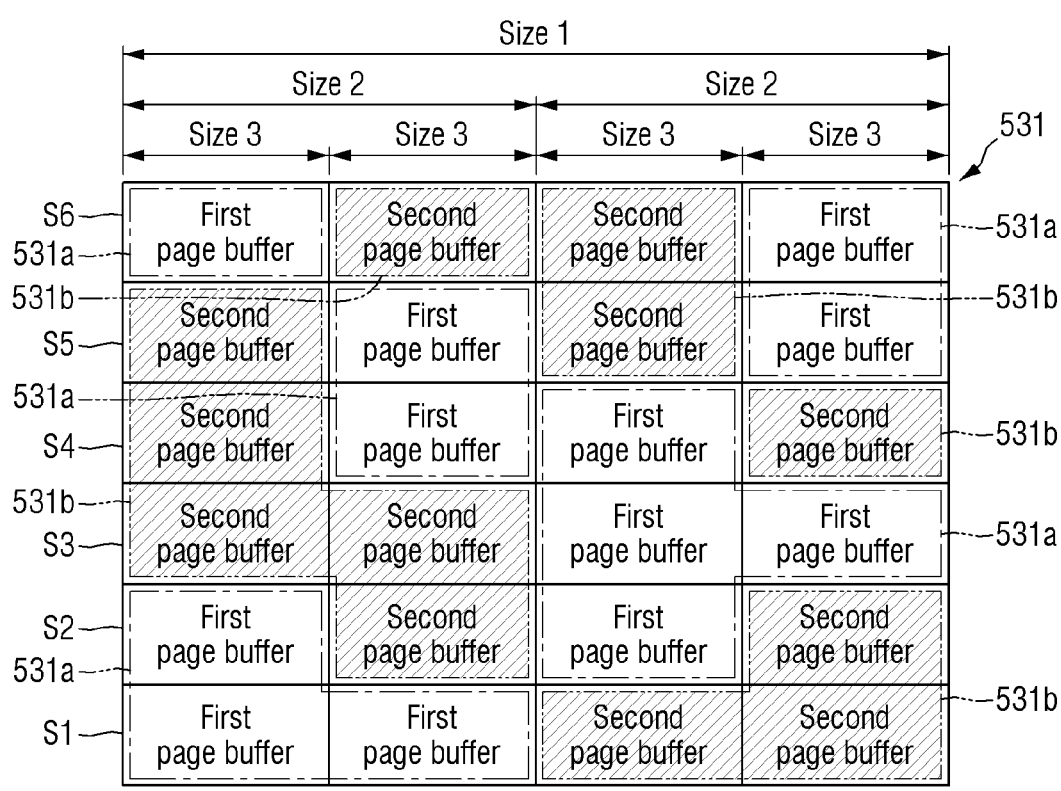

FIGS. 14 and 15 are respective conceptual diagrams illustrating possible physical configurations for the page buffer circuit 531 of FIG. 7, and may be compared with the conceptual diagram of FIG. 11.

Referring to FIG. 14, the page buffer circuit 531 may have the same type of page buffer for each half column in the first to sixth stages S1 to S6. For example, for the first stage S1, the third stage S3, the fourth stage S4, and the sixth stage S6, the half columns of the front parts having the second size (Size 2) may be configured as the first page buffers 531a, and the half columns of the rear parts may be configured as the second page buffers 531b.

On the other hand, for the second stage S2 and the fifth stage S5, the half columns of the front parts having the second size (Size 2) may be configured as the second page buffers 531b, and the half columns of the rear parts may be configured as the first page buffers 531a.

In this case, the half columns of the front parts of the first stage S1, the third stage S3, the fourth stage S4, and the sixth stage S6 may be connected to the half columns of the rear parts of the second stage S2 and the fifth stage S5 to derive first data for the first page buffers 531a.

Also, on the other hand, the half columns of the front parts of the second stage S2 and the fifth stage S5 may be connected to the half columns of the front parts of the first stage S1, the third stage S3, the fourth stage S4, and the sixth stage S6 to derive second data for the second page buffers 531b.

Alternatively, the first page buffer 531a and the second page buffer 531b may be processed independently and in parallel on only a sampled stage among the first to sixth stages S1 to S6.

That is, although arrangement is not made inside the page buffer structure 531, a page buffer type may be determined in units of a second size (Size 2), and a connection relationship may be formed such that page buffers of the same types are calculated together. In this case, accurate data read from memory cells connected to the outer pillar P1 strings and from memory cells connected the inner pillar P2 strings may be obtained.

Thus, with the memory device according to embodiments of the inventive concept, it is possible to further improve reliability of the data read operation.

Referring to FIG. 15, in the page buffer circuit 531, sensing may be independently performed for each unit having the third size (Size 3) in the first to sixth stages S1 to S6. That is, the half column of the front part having the second size (Size 2) and the half column of the rear part having the second size (Size 2) do not need to have the same type.

Each stage may include four units having the third size (Size 3). For example, for the sixth stage S6, the first and fourth units having the third size (Size 3) may be configured as the first page buffers 531a, and the second and third units may be configured as the second page buffers 531b.

Each of the other stages may include a unit composed of two first page buffers 531a and a unit composed of two second page buffers 531b.

In this case, the units constituting the first page buffers 531a in respective stages may be connected to each other to derive the first data for the first page buffers 531a.

Also, on the other hand, the units constituting the second page buffers 531b in respective stages may be connected to each other to derive the second data for the second page buffers 531b.

Alternatively, the first page buffer 531a and the second page buffer 531b may be processed independently and in parallel on only a sampled stage among the first to sixth stages S1 to S6.

That is, although arrangement is not made inside the page buffer structure 531, a page buffer type may be determined in units of a second size (Size 2), and a connection relationship may be formed such that page buffers of the same types are calculated together. In this case, accurate data read from memory cells connected to outer pillar P1 strings and from memory cells read from the inner pillar P2 strings may be obtained.

According to this embodiment, calculation may be performed irrespective of the arrangement of the page buffer structure 531 while the first page buffer 531a and the second page buffer 531b are separated from each other. Thus, it is possible to facilitate improved connection designs between bit lines and page buffers in certain embodiments of the inventive concept.

In addition, it is possible to derive accurate data for the first pillar P1 and the second pillar P2. Thus, with the memory device according to some embodiments of the inventive concept, it is possible to further improve the reliability of the data read operation.

Figure 16:
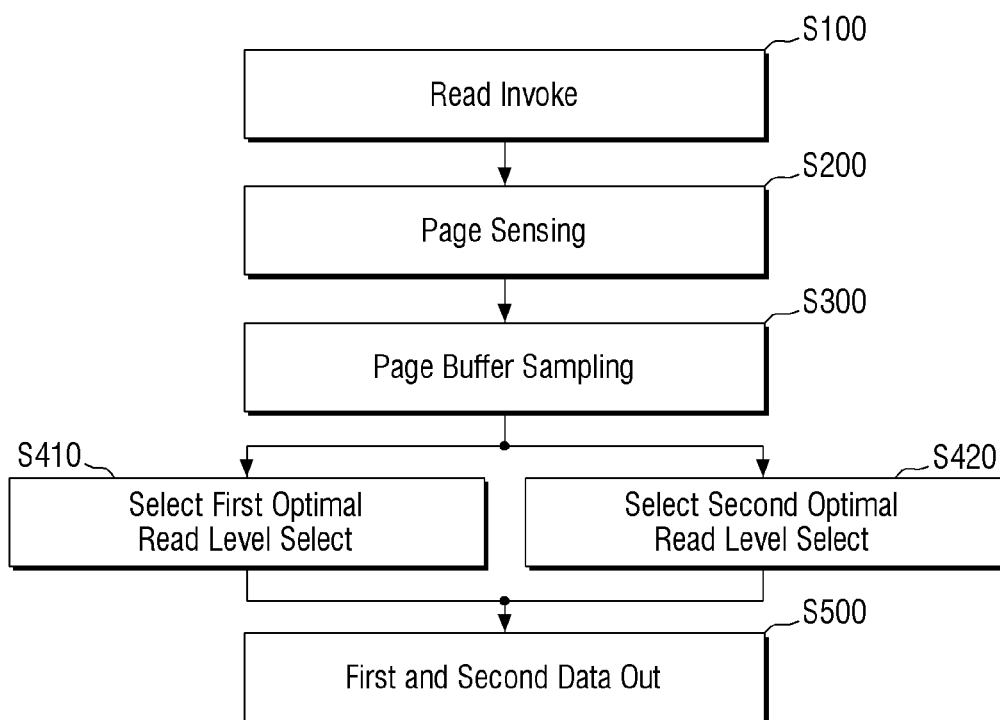
FIG. 16 is a flowchart summarizing a method of reading a memory device according to embodiments of the inventive concept.

A method of reading data from a memory device according to embodiments of the inventive concept will be described with reference to FIGS. 1, 7, 8, 9, 10, 11 and 16, where FIG. 16 is a flowchart illustrating a read operation.

Referring to FIG. 16, the exemplary read method begins in response to a read request being received (S100). That is, referring to FIG. 1, the memory controller 300 may request a read operation by transmitting at least one of a control signal CTRL, a command CMD, and an address ADDR to the memory device 500.

Next a data sensing step of performed. For example a selected page of data may be sensed in response to the read request (S200). That is, referring to FIGS. 9 and 10, a page sensing step may include initialization, pre-charging, bit line developing, offset developing, and sensing.

Here, consistent with the previous description and during the page sensing step (S200) of the method illustrated in FIG. 16, the sensing latch Rg1 maybe initialized; a sensing node SO may be pre-charged to a predetermined voltage level, and a bit line shut-off signal BLSHF may transition to a pre-charge voltage, such that a first bit line BLo and a second bit line BLi connected to the sensing node SO are charged to a predetermined voltage level. Then, the pre-charging of the first bit line BLo ends, and the bit line shut-off signal BLSHF transitions to a developing voltage lower than the pre-charge voltage but higher than ground voltage. Under these conditions, electrical charge in the first bit line BLo will either be retained or released to the common source line CSL depending on the ON/OFF state of a target memory cell. Then, the voltage levels of the first bit line BLo and the second bit line BLi may decrease further when the memory cell MC is turned ON as compared to when the memory cell MC is turned OFF. And then, a determination as to whether the memory cell MC is ON or OFF may be made depending on whether the first register Rg1 (e.g., the sensing latch) is flipped.

Once the page sensing step (S200) of the read method illustrated in FIG. 16 is completed, the read page data (e.g., the resulting read data temporarily stored in in read buffer) may be sampled (S300). For example, referring to FIG. 11, each and every one of the page buffers constituting the page buffer circuit 531 need not be used to sample the page data. Rather, only some of the page buffers in the page buffer circuit 531 may be used to sample the sensed read data. Here, it should be noted that the sensing and sampling steps may be performed simultaneously in certain embodiments of the inventive concept. Accordingly, as an example, only the first stage S1, the second stage S2, and the fourth stage S4 among the first to sixth stages S1 to S6 may be used to sample the page data.

Once the page data has been sampled (S300), a first optimal read voltage level may be selected (S410) and/or a second optimal read voltage may be selected (S420).

That is, referring to FIGS. 7, 8, 9 and 10, the read voltage determination unit 532 may be used to determine (or select) an optimal read voltage from a plurality of stored candidate read levels in accordance with a sampled data set. Thus, with reference to FIG. 13(b), where one data set obtained from memory cells connected to outer pillar P1 strings is sampled a first read voltage RL1 may be selected, or with reference to FIG. 13(c), where another data set obtained from memory cells connected to inner pillar P2 strings is sampled, a third read voltage RL3 may be selected.

Accordingly, in certain embodiments of the inventive concept, data values corresponding to respective candidate read voltages may be stored in the first page buffer 531a. The read voltage determination unit 532 may then receive the sampled data results and identify an optimal read voltage from among the plurality of candidate read voltages. As previously described, each of the second register Rg2, the third register Rg3, and the fourth register Rg4 may be used as a register to store a data value corresponding to a candidate read voltage in the illustrated embodiments shown, for example in FIGS. 9 and 10.

After one or both of the first optimal read voltage and the second optimal read voltage has been selected S410 and S420, the first data and second data may be output (S500). That is, referring to FIG. 8, the first data DATA1 may be output by the first page buffer 531a, and the second data DATA2 may be output by the second page buffer 531b.

While the inventive concept has been particularly shown and described with reference to exemplary embodiments thereof, it will be understood by those of ordinary skill in the art that various changes in form and details may be made therein without departing from the spirit and scope of the inventive concept as recited by the following claims. It is therefore desired that the present embodiments be considered in all respects as illustrative and not restrictive, reference being made to the appended claims rather than the foregoing description to indicate the scope of the inventive concept.

What is claimed is:
1. A non-volatile memory, comprising:
a memory cell region extending in a first horizontal direction and including a first outer region proximate a first end of the memory cell region, an inner region separated from the first end by the first outer region, and a second outer region proximate a second end of the memory cell region, wherein an arrangement of the first end, the first outer region, the inner region, the second outer region and the second end extends in a second horizontal direction that is orthogonal to the first horizontal direction;
an inner memory cell string including memory cells of the memory cell region that are connected to an inner pillar extending vertically upward through the inner region;
outer memory cell strings including memory cells of the memory cell region that are connected to first outer pillars extending vertically upward through the first outer region and memory cells of the memory cell region that are connected to second outer pillars extending vertically upward through the second outer region;
a first bit line connected to the inner pillar and extending in the second horizontal direction;
second bit lines respectively connected to the first and second outer pillars and extending in the second horizontal direction; and
a page buffer circuit including a first latch and a second latch,
wherein the first latch is connected to the first bit line and configured to sense first data in the inner memory cell string using a first sensing developing time, and the second latch is connected to a second bit line from among the second bit lines and configured to sense second data in an outer memory cell string from among the outer memory cell strings that is connected to the second bit line, wherein data of the outer memory cell strings are sensed using a second sensing developing time different from the first sensing developing time.

2. The non-volatile memory of claim 1, wherein the page buffer circuit includes a first page buffer circuit connected to the first bit line, the first page buffer circuit includes the first latch and a third latch, and the third latch is connected to the first bit line and configured to sense third data in the inner memory cell string using a third sensing developing time different from the first sensing developing time.

3. The non-volatile memory of claim 2, wherein the page buffer circuit further includes a second page buffer circuit connected to the second bit line, the second page buffer circuit includes the second latch and a fourth latch, and the fourth latch is connected to the second bit line and configured to sense fourth data in the outer memory cell string using a fourth sensing developing time different from the second sensing developing time.

4. The non-volatile memory of claim 3, further comprising:

a data input/output (I/O) circuit including the page buffer circuit, wherein the data I/O circuit performs a first mass bit counting for the first data in the first latch and the third data in the third latch, and a second mass bit counting for the second data in the second latch and the fourth data in the fourth latch.

5. The non-volatile memory of claim 4, wherein the data I/O circuit outputs a first output data based on the first mass bit counting and a second output data based on the second mass bit counting.

6. The non-volatile memory of claim 3, wherein the first page buffer circuit includes a plurality of first page buffers and the second page buffer circuit includes a plurality of second page buffers.

7. The non-volatile memory of claim 1, wherein the page buffer circuit includes a first page buffer circuit connected to the first bit line, the first page buffer circuit includes the first latch and a plurality of first candidate latches, and the plurality of first candidate latches are connected to the first bit line and configured to sense a plurality of candidate first data in the inner memory cell string using a plurality of first candidate sensing developing times different from the first sensing developing time.

8. The non-volatile memory of claim 7, further comprising:

a data input/output (I/O) circuit including the page buffer circuit, wherein the data I/O circuit selects a first optimal read voltage to be used during a first read operation for the inner memory cell string using the first data in the first latch and the plurality of candidate first data in the plurality of first candidate latches.

9. The non-volatile memory of claim 8, wherein the page buffer circuit further includes a second page buffer circuit connected to the second bit line, the second page buffer circuit includes the second latch and a plurality of second candidate latches, and the plurality of second candidate latches are connected to the second bit line and configured to sense a plurality of candidate second data in the outer memory cell string using a plurality of second candidate sensing developing times different from the second sensing developing time.

10. The non-volatile memory of claim 9, wherein the data I/O circuit selects a second optimal read voltage to be used during a second read operation for the outer memory cell string using the second data in the second latch and the plurality of candidate second data in the plurality of second candidate latches.

11. A non-volatile memory, comprising:

a memory cell region extending in a first horizontal direction and including an outer region proximate a first end of the memory cell region and an inner region separated from the first end by the outer region, wherein an arrangement of the first end, the outer region and the inner region extends in a second horizontal direction that is orthogonal to the first horizontal direction;

an inner memory cell string including memory cells of the memory cell region that are connected to an inner pillar extending vertically upward through the inner region;

an outer memory cell string including memory cells of the memory cell region that are connected to an outer pillar extending vertically upward through the outer region;

a first bit line connected to the inner pillar and extending in the second horizontal direction;

a second bit line connected to the outer pillar and extending in the second horizontal direction; and a data input/output (I/O) circuit comprising a first page buffer circuit connected to the first bit line, and a second page buffer circuit connected to the second bit line, wherein the first page buffer circuit includes a first latch configured to sense first data in the inner memory cell string using a first sensing developing time, and a second latch configured to sense second data in the inner memory cell string using a second sensing developing time different from the first sensing developing time, and the second page buffer circuit includes a third latch configured to sense third data in the outer memory cell string using a third sensing developing time, and a fourth latch configured to sense fourth data in the outer memory cell string using a fourth sensing developing time different from the third sensing developing time.

12. The non-volatile memory of claim 11, wherein the data I/O circuit selects a first optimal read voltage to be used during a first read operation for the inner memory cell string using the first data in the first latch and the second data in the second latch, and the data I/O circuit selects a second optimal read voltage to be used during a second read operation for the outer memory cell string using the third data in the third latch and the fourth data in the fourth latch.

13. The non-volatile memory of claim 12, wherein the first optimal read voltage is different from the second optimal read voltage.

14. The non-volatile memory of claim 11, wherein the data I/O circuit performs a first mass bit counting for the first data in the first latch and the second data in the second latch, and a second mass bit counting for the third data in the third latch and the fourth data in the fourth latch.

15. The non-volatile memory of claim 14, wherein the data I/O circuit outputs a first output data based on the first mass bit counting and a second output data based on the second mass bit counting.

16. A method of reading data in a non-volatile memory including a memory cell region having a first end, a first outer region proximate the first end, an inner region separated from the first end by the first outer region, a second outer region proximate a second end of the memory cell region, first bit lines, a second bit line, an inner memory cell string including second memory cells connected to an inner pillar extending vertically upward through the inner region, outer memory cell strings including first memory cells connected to first outer pillars extending vertically upward through the first outer region and first memory cells connected to second outer pillars extending vertically upward through the second outer region, and a data input/output (I/O) circuit, the method comprising:

sensing first data stored in memory cells from among the first memory cells through a first bit line from among the first bit lines using a first sensing developing time, and sensing second data stored in the second memory cells through the second bit line using a second sensing developing time, wherein data of the outer memory cell strings are sensed using the first sensing developing time that is different from the second sensing developing time.

17. The method of reading data in the non-volatile memory of claim 16, further comprising:

sensing third data stored in the memory cells from among the first memory cells through the first bit line using a third sensing developing time different from the first sensing developing time, and sensing fourth data stored in the second memory cells through the second bit line using a fourth sensing developing time different from the second sensing developing time.

18. The method of reading data in the non-volatile memory of claim 17, further comprising:

performing a first mass bit counting for the first data and the third data, and performing a second mass bit counting for the second data and the fourth data.

19. The method of reading data in the non-volatile memory of claim 18, further comprising:

selecting one of the first and third data based on the first mass bit counting and outputting the selected one of the first and third data as a first output data, and selecting one of the second and fourth data based on the second mass bit counting and outputting the selected one of the second and third data as a second output data.

20. The method of reading data in the non-volatile memory of claim 16, further comprising:

sensing third data stored in the memory cells from among the first memory cells through the first bit line using a third sensing developing time different from the first sensing developing time, sensing fourth data stored in the memory cells from among the first memory cells through the first bit line using a fourth sensing developing time different from the first and third sensing developing times, performing a first mass bit counting for the first data, the third data and the fourth data, and selecting one of the first, third and fourth data based on the first mass bit counting and outputting the selected one of the first, third and fourth data as a first output data.

* * * * *